(12) United States Patent
Heard et al.

(10) Patent No.: US 7,978,476 B2
(45) Date of Patent: Jul. 12, 2011

(54) ELECTRONIC SYSTEM WITH NON-PARALLEL ARRAYS OF CIRCUIT CARD ASSEMBLIES

(75) Inventors: Christopher Heard, Brookline, NH (US); Andreas C. Pfahnl, Goffstown, NH (US)

(73) Assignee: Amphenol Corporation, Wallingford, CT (US)

( * ) Notice: Subject to any disclaimer, the term of this patent is extended or adjusted under 35 U.S.C. 154(b) by 1993 days.

(21) Appl. No.: 10/954,865

(22) Filed: Sep. 30, 2004

(65) Prior Publication Data

US 2006/0067069 A1    Mar. 30, 2006

(51) Int. Cl.
*H05K 5/00*      (2006.01)
(52) U.S. Cl. .................. 361/752; 174/255; 439/65
(58) Field of Classification Search .......... 361/788, 361/796, 721, 752, 704, 719, 707; 174/255; 439/65
See application file for complete search history.

(56) References Cited

U.S. PATENT DOCUMENTS

| | | | | |
|---|---|---|---|---|
| 4,600,256 A | * | 7/1986 | Anttila | 439/65 |
| 4,876,630 A | | 10/1989 | Dara | |
| 5,057,968 A | * | 10/1991 | Morrison | 361/700 |
| 5,835,349 A | * | 11/1998 | Giannatto et al. | 361/701 |
| 6,163,464 A | | 12/2000 | Ishibashi et al. | |
| 6,335,867 B1 | | 1/2002 | Ishibashi et al. | |
| 6,392,142 B1 | * | 5/2002 | Uzuka et al. | 174/541 |
| 7,342,789 B2 | * | 3/2008 | Hall et al. | 361/701 |
| 7,643,286 B2 | * | 1/2010 | Hirai et al. | 361/679.5 |
| 2002/0046878 A1 | | 4/2002 | Uzuka et al. | |

FOREIGN PATENT DOCUMENTS

| | | |
|---|---|---|
| DE | 7344279 | 3/1974 |
| DE | 2320202 | 11/1974 |
| DE | 8910752 | 11/1989 |

OTHER PUBLICATIONS

Virtual Midplane Realizes Ultrafast Card Interconnects, Michael Fowler, EE Online ID#1771, Dec. 9, 2002. Downloaded Nov. 11, 2004 from http://www.elecdesign.com/Articles/Print.cfm?ArticleID=1771.
Model 6676 ForeFront Xtreme Chassis Assembly, User Guide, Document No. 120031U Rev.A, Patton Electronics Co., Dec. 18, 2003. Downloaded Dec. 8, 2004 from http://www.patton.com/manuals/6676.pdf.
Otis et al., "Low Profile Internal Cabling Raceway," IBM Technical Disclosure Bulletin, vol. 37, No. 10, pp. 625-626, Oct. 1994.

* cited by examiner

*Primary Examiner* — Tuan T Dinh
*Assistant Examiner* — Abiy Getachew
(74) *Attorney, Agent, or Firm* — Blank Rome LLP

(57) ABSTRACT

An electronic assembly for housing circuit cards of different types, which communicate with one another at high speed. Circuit cards of a first type plug into a backplane side-by-side. Circuit cards of a second type are arranged perpendicularly to the circuit cards of the first type. The arrangement allows cards of the first type to communicate with cards of the second type over short distances, thus improving system throughput. It also allows cards of different types to be cooled differently, thus promoting efficient cooling.

26 Claims, 2 Drawing Sheets

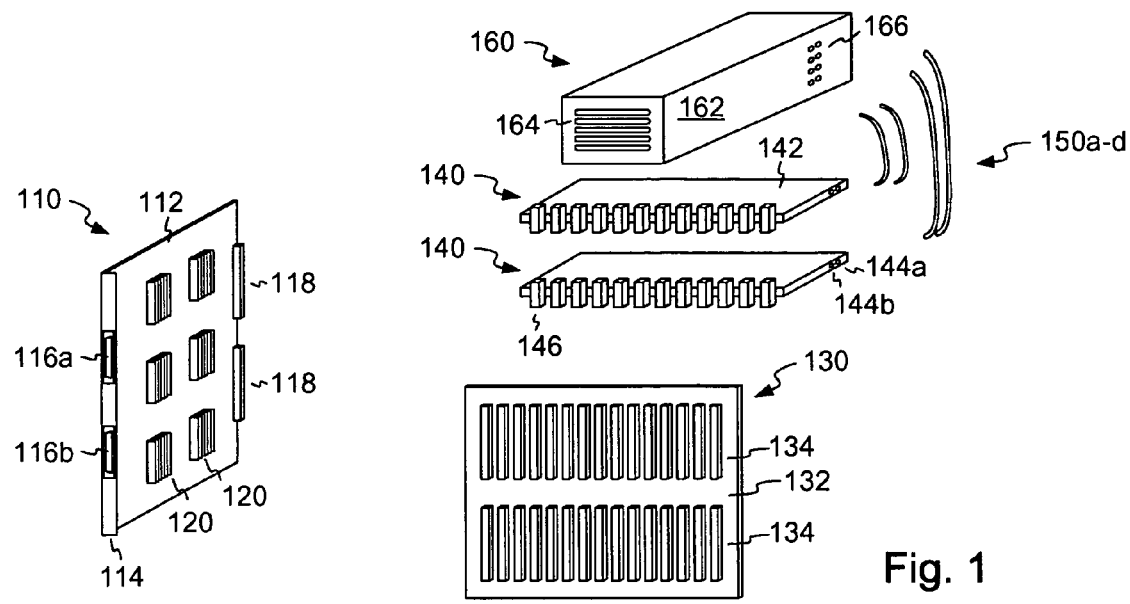
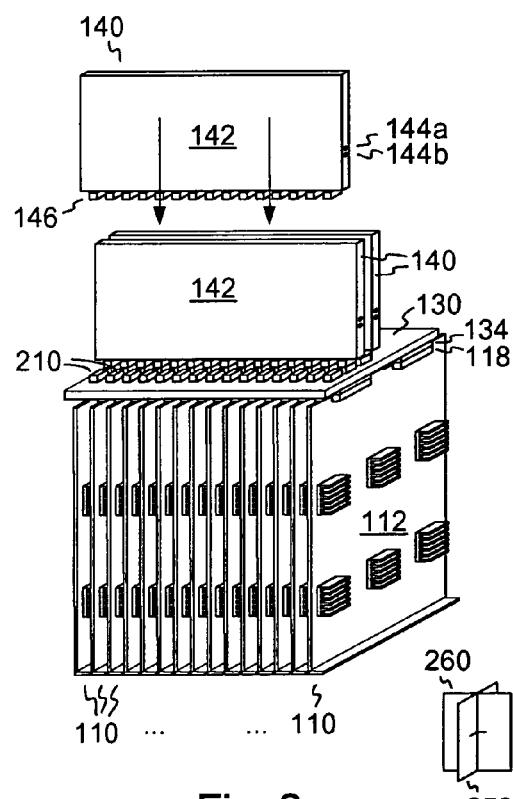
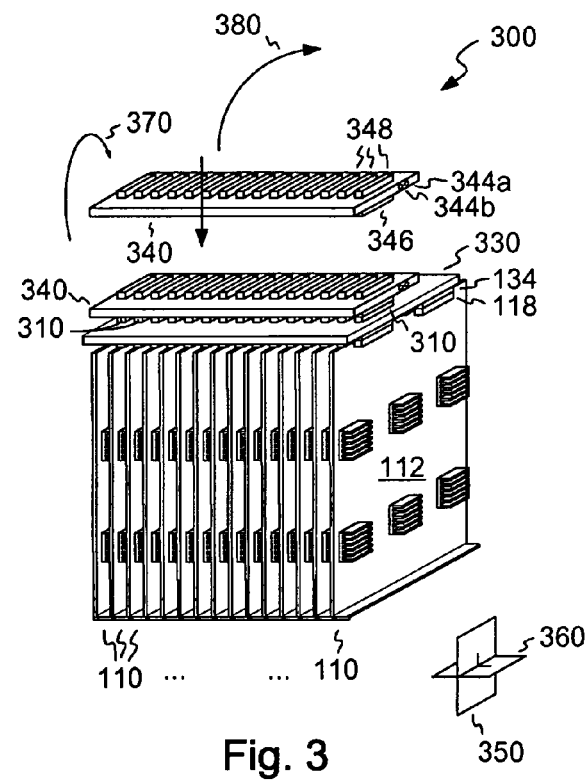

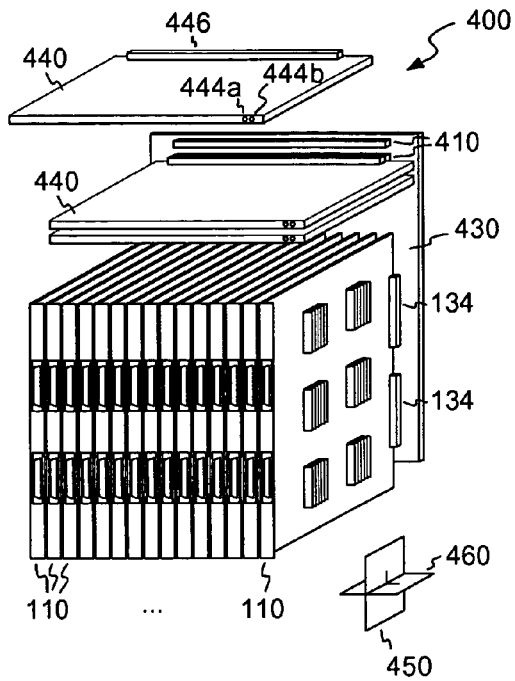
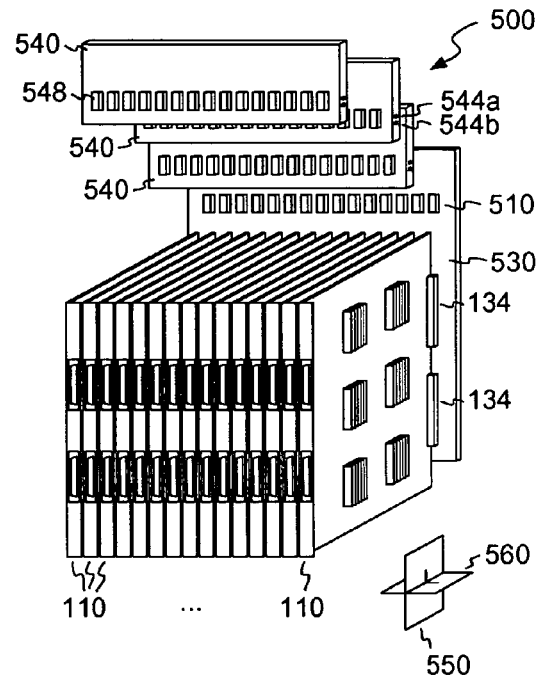
Fig. 4      Fig. 5
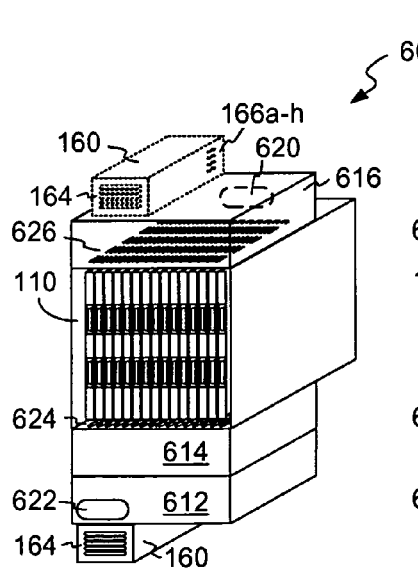
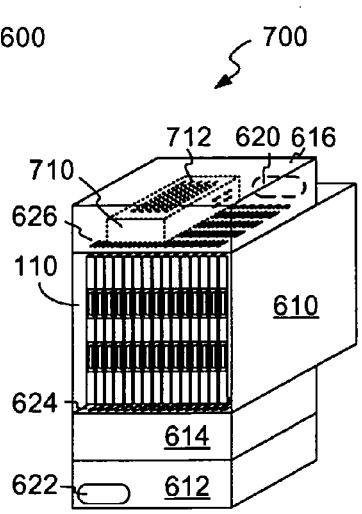
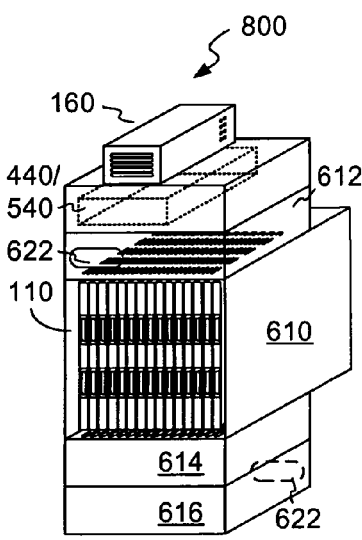
Fig. 6      Fig. 7      Fig. 8

ELECTRONIC SYSTEM WITH NON-PARALLEL ARRAYS OF CIRCUIT CARD ASSEMBLIES

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND

1. Field of the Invention

This invention relates generally to electronic assemblies, and, more particularly, to arrangements of electronic assemblies for improving signal transmission.

2. Description of Related Art

Electronic assemblies are commonly manufactured in the form of circuit cards that plug into a backplane. Numerous electronic components are attached to each circuit card and are connected together via conductive traces or wires. Each circuit card generally has one or more connectors at one end, which mate with respective connector(s) on the backplane. Different circuit cards plug into different standard locations, or "slots," of the backplane, substantially in parallel. The backplane is typically itself a circuit card, to which numerous connectors are attached for receiving circuit cards in different slots. The backplane generally includes traces or wires for establishing connections between circuit cards.

The circuit cards and the backplane are generally housed together within an enclosure called a "card cage" or "chassis." In addition to the circuit cards and backplane, the chassis generally includes power supplies for energizing the circuit cards and air movers such as fans or blowers for cooling the circuit cards. The chassis also typically includes card guides, which form channels within which circuit cards can slide to ensure that they are inserted into backplane connectors with proper spacing and alignment.

We have recognized that many electronic applications involve drawing together large numbers of electronic signals from different locations, or "nodes," and selectively switching the signals to various destinations. An example of this application includes computer networking systems, such as those managed by Internet Service Providers (ISP's). As is known, computer networking systems generally include a chassis having a backplane loaded with circuit cards and connected to the backplane in parallel, essentially as described above. The circuit cards include I/O cards (also called "line cards") for accessing network nodes to send and/or receive network data. The circuit cards also include switch cards (also called "fabric" cards) for routing network data among the I/O cards.

I/O cards and switch cards generally operate together to route large amounts of network data simultaneously. To perform this role, network data arriving at an I/O card is generally conveyed to one or more switch cards via the backplane. The switch card(s) typically identify a destination, and they route the network data over the backplane to an appropriate I/O card.

We have recognized that the customary arrangement of parallel circuit cards plugged into a backplane has certain shortcomings when used in this and other applications. For instance, network data sent between I/O cards and switch cards can travel greatly varying distances depending upon the slots into which the respective cards are inserted. These different distances involve proportionally different propagation delays. Signals traveling greater distances are also subject to attenuation and possibly corruption due to conductive and/or dielectric losses. To minimize distances, the switch cards can be inserted into slots located toward the middle of the chassis (e.g., in slots 6 and 7 of a 13-slot chassis). Worst case backplane distances are then reduced by approximately one-half. The distances are still highly variable, however. In addition, as systems become faster, even these reduced distances present significant obstacles to throughput. Data rates exceeding 10 GBits/s are now common in the industry.

What is desired is an improved arrangement for further reducing worst case signal propagation distances and their variability.

SUMMARY

According to an embodiment of the invention, an electronic system includes a plurality of first connectors adapted for receiving a plurality of first circuit cards and at least one second connector adapted for receiving at least one second circuit card. The plurality of first connectors are arranged for receiving the plurality of first circuit cards side-by-side and in parallel with one another. However, each second connector is arranged for receiving a circuit card in a non-parallel, preferably perpendicular, orientation with respect to each of the plurality of first circuit cards.

According to one variation, the plurality of first circuit cards are adapted for sending and/or receiving network data and the at least one second circuit card is adapted for switching network data.

According to another variation, the plurality of first circuit cards and the at least one second circuit card are cooled by separate cooling systems.

BRIEF DESCRIPTION OF THE DRAWINGS

The ensuing description will be better understood by reference to the accompanying drawings, in which—

FIG. 1 is an exploded, isometric view of a first embodiment of an electronic system;

FIG. 2 is an isometric view of the first embodiment of the electronic system of FIG. 1 in a partially assembled state, wherein circuit board assemblies are perpendicularly arranged;

FIG. 3 is an isometric view of a second embodiment of an electronic system in which circuit board assemblies are perpendicularly arranged;

FIG. 4 is an isometric view of a third embodiment of an electronic system, in which circuit board assemblies are perpendicularly arranged;

FIG. 5 is an isometric view of a fourth embodiment of an electronic system in which circuit board assemblies are perpendicularly arranged;

FIG. 6 is an isometric view of an electronic system of any of FIGS. 2-3 provided in a card cage and arranged in a first manner;

FIG. 7 is an isometric view of an electronic system of any of FIGS. 2-3 provided in a card cage and arranged in a second manner; and FIG. 8 is an isometric view of an electronic system of any of FIGS. 4-5 provided in a card cage and arranged in a third manner.

DETAILED DESCRIPTION OF THE PREFERRED EMBODIMENT

As used throughout this document, the words such as "comprising," "including," and "having" are intended to set forth certain items, steps, elements, or aspects of something in an open-ended fashion. Unless a specific statement is made to the contrary, these words do not indicate a closed list to which additional things cannot be added.

FIGS. 1 and 2 show an electronic system having components arranged according to an illustrative embodiment of the invention. FIG. 1 shows a partial, exploded view of the arrangement. The arrangement includes a circuit card assembly 110 of a first type, a backplane assembly 130, circuit card assemblies 140 of a second type, a cooling assembly 160, and fluid transport passages 150a-d, such as hoses. Alternatively, blind mate fluid transport passages may be used.

In a preferred embodiment, the electronics system is a telecommunications switching system wherein the circuit card assemblies 110 of the first type are I/O cards, and the circuit card assemblies 140 of the second type are switch cards.

Each of the circuit card assemblies 110 of the first type preferably includes an insulative substrate 112, made of FR4, Nelco 4013si, or some other suitable material. The circuit card assembly 110 preferably has a front panel 114 and one or more backplane connectors 118. Front panel connectors 116a and 116b are preferably provided for accessing external telecommunications nodes. The circuit card assembly 110 may also include heat sinks 120 to facilitate the cooling of electronic components.

The backplane assembly 130 is preferably also a circuit card assembly. It preferably includes a substrate 132 made of an insulative material. Connectors 134 are attached to the substrate. Wires or conductive traces formed upon or within the substrate (not shown) interconnect electrical contacts of the different connectors. The connectors 134 of the backplane assembly 130 are adapted for mating with connectors 118 on circuit card assemblies 110, when the circuit card assemblies are plugged into the backplane.

Each of the circuit card assemblies 140 of the second type includes an insulative substrate 142 and backplane connectors 146. As best seen in FIG. 2, an array of connectors 210 are attached to the rear of backplane assembly 130 and are arranged for mating with the connectors 146 on the circuit card assemblies 140 of the second type.

The backplane connectors 134 can generally be regarded as "first" connectors, or connectors of a "first" type, because they are intended to mate with circuit card assemblies of the first type. Similarly, the backplane connectors 210 can be regarded as "second" connectors, or connectors of a "second" type, because they are intended to mate with circuit card assemblies of the second type. Alternative arrangements described below, in connection with FIGS. 3-5, also have "first" and "second" connectors for engaging circuit card assemblies of the first and second type, respectively.

Preferably each connector 210 is located directly opposite the backplane substrate 132 from one of the connectors 134. Electrical signals to be exchanged between the circuit card assemblies 110 and 140 are preferably passed substantially straight through the substrate 132 of the backplane assembly. For instance, a signal passing from an assembly 110 of the first type to an assembly 140 of the second type generally passes through a backplane connector 118, through a connector 134, through the substrate 132, through a connector 210, through a connector 146, and onto the card assembly 140. In the preferred embodiment, plated holes run straight through the substrate 132, and connectors 134 and 210 are mounted back-to-back on opposite sides of the substrate with their respective contacts extending through the same plated holes.

Each of the circuit card assemblies 140 preferably includes signal buffers, such as SerDes receivers, positioned close to the connectors 146. The SerDes receivers convert high-speed, serial data streams received via the backplane into much slower, parallel data, which can be transmitted within the assembly 140 with far less criticality.

As shown in FIG. 2, three rows of connectors 210 are provided at the rear of the backplane assembly 130 for engaging circuit card assemblies 140. The specific number of card assemblies 110 of the first type and card assemblies 140 second type can be varied according to the requirements of the target application.

As shown and described, the backplane assembly 130 has a first set of connectors 134 mounted on its front surface and a second set of connectors 210 mounted on its rear surface. As best seen in FIG. 2, the first set of connectors 134 is adapted for engaging circuit card assemblies 110 in an orientation that is parallel to a first plane 250, whereas the second set of connectors 210 is adapted for engaging circuit card assemblies 140 in an orientation that is parallel to a second plane 260. The first and second planes 250 and 260 are substantially perpendicular to each other, i.e., they intersect each other substantially at right angles.

This arrangement shown in FIG. 2 accomplishes two objectives. First, it provides very short paths for electrical signals transmitted between the first card assemblies 110 and the second card assemblies 140. Second, it substantially equalizes the delays of signals passing between these assemblies, as signals are not required to travel substantially different distances along the length of the backplane.

Switch cards of a telecommunications system are generally much more power dissipative than I/O cards. A benefit of the arrangement of FIG. 2 is that the two different types of cards are located in different places, and may thus be cooled separately. Each cooling system can be optimized for its particular thermal load. Preferably, the first assemblies 110 are cooled by forcing air through the spaces between the assemblies. Air is made to flow over and through the heat sinks 120 and remove heat from the dissipative components of the assemblies 110.

The generally hotter circuit card assemblies 140 are preferably liquid cooled. To allow for liquid cooling, each circuit card assembly 140 preferably includes a cold plate 142. The cold plate 142 is generally placed in close thermal contact with power dissipative components within the assembly 140. The cold plate is coupled to a pair of coolant ports, 144a and 144b. Liquid coolant is made to flow into port 144a, through the cold plate 142, and then back out of the assembly via port 144b. Heat from the components of the assembly 140 is thus drawn into the cold plate and away from the assembly 140.

A cooling assembly 160 is preferably used to circulate liquid coolant through the cold plate of each circuit card assembly 140. The cooling assembly 160 preferably has multiple fluid ports 166. Half of these ports are inputs, and half of them are outputs. A fluid transport pathway, such as a hose (one of 150a-d) or a blind-mate fluid attachment, is used to connect an output port of the cooling assembly 160 to an input port 144a of each assembly 140. Preferably, a hose is used. Similarly, a hose or other fluid transport pathway is used to connect an input port of the cooling assembly 160 to an output port 144b of the respective assembly 140.

Hoses are shown schematically in FIG. 1 as 150a-d; however, they are omitted from the other figures to avoid excessive detail. It should be understood, however, that hoses or some other form of fluid transport passages are part of each of the implementations shown in FIGS. 2-8.

The cooling assembly 160 is preferably a modular, self-contained unit. It preferably includes a front air intake 164 and a rear outlet (not shown). Within, the cooling assembly preferably includes an air mover (such as a fan or blower), a liquid-to-air heat exchanger (a radiator), a tank, and a pump (none shown). Liquid coolant is pumped through the cold plates of the circuit card assemblies 140 and through the radiator. The air mover induces air to pass through the radiator. The temperature of the coolant is thus reduced, and the coolant is re-circulated through the cold plates to cool the circuit card assemblies 140.

The separate cooling arrangements for the first circuit assemblies 110 and the second circuit card assemblies 140 promote efficiency and avoids different conflicting air flow paths in a system. For example, air movers used to cool the assemblies 110 need only produce enough airflow to cool the assemblies 110. They need not be powerful enough to cool the hotter assemblies 140. Liquid cooling of the assemblies 140 also allows them to be run at higher data rates with increased power dissipation, because liquid cooling can generally provide greater cooling capacity.

FIG. 3 shows an alternative arrangement 300 for an electronic system. The arrangement 300 is similar in many respects to that of FIGS. 1 and 2. It differs, however, in the orientation of the circuit card assemblies of the second type. Rather than engaging the backplane assembly 130 perpendicularly, as they do in FIG. 2, circuit card assemblies 340 of the arrangement 300 plug into a modified backplane assembly 330 substantially in parallel with the backplane 330.

Preferably, the circuit card assemblies 340 of the second type plug are stacked one on top of the other. Each assembly 340 preferably includes a first array of connectors 346 on a bottom surface and a second array of connectors 348 on a top surface. The connectors 346 of the bottom-most assembly 340 engage mating connectors 310 on the backplane 330. Successive assemblies 340 engage mating connectors 348 on the assembly 340 located immediately below them in the stack.

The connectors 310 on the backplane 330 may be identical to the connectors 210 shown in FIG. 2. Preferably, however, the connectors 310 are somewhat longer, for conveying signals to multiple, stacked assemblies 340.

In a variation on the arrangement 300 (not shown), the circuit card assemblies 340 are not stacked one on top of one another, but are instead placed one next to the other, with the assemblies 340 all parallel to the backplane 330. The number of assemblies 340 in this arrangement is then limited by the width of the backplane 330 and the width of the assemblies 340. In yet another variation on the arrangement 300, the circuit card assemblies 340 are stacked vertically, as shown; however, different stacks are then laid one next to the other.

The arrangement 300 is cooled the same way as the arrangement of FIGS. 1 and 2. The circuit card assemblies 110 are preferably air cooled, and the circuit card assemblies 340 are preferably liquid cooled, essentially as described above. Each of the circuit card assemblies 340 includes a pair of liquid cooling ports, 344a and 344b, for circulating coolant with the cooling assembly 160.

Despite the change in angle of the assemblies 340, it is evident that the assemblies 110 and 340 are still substantially perpendicular to each other. The assemblies 110 are parallel to a first plane 350, and the assemblies 340 are parallel to a second plane 360. The planes 350 and 360 are perpendicular.

It is not necessary that the circuit card assemblies of the second type be either (i) strictly perpendicular to the backplane (as they are in FIG. 2) or (ii) strictly parallel to the backplane (as they are in FIG. 3). The assemblies of the second type (140/340) may be angled (see line 370) between the positions shown in FIGS. 2 and 3. Note that, even when angled this way, the planes parallel to the two types of assemblies remain perpendicular to each other.

By placing the assemblies 140/340 of the second type behind the backplane, the arrangements of FIGS. 2 and 3 free up substantial space for additional assemblies 110 of the first type. Therefore, this arrangement not only improves signal integrity and transmission, but it also allows the capacity of the system to be increased.

FIGS. 4 and 5 show two other alternative arrangements 400 and 500 of an electronic system. Both of these arrangements differ from those of FIGS. 2 and 3 in that the circuit card assemblies of the second type engage the backplane on the same side as the assemblies 110. The arrangements 400 and 500 may provide advantages in places such as wiring closets, where areas behind the backplane are not easily accessible. They may also provide advantages in smaller spaces where little depth is available.

As shown in FIG. 4, the arrangement 400 includes a backplane 430, circuit card assemblies 110 of the first type, and circuit card assemblies 440 of the second type. The assemblies 110 are preferably air cooled, whereas the assemblies 440 are preferably liquid cooled, essentially as described above. Liquid coolant ports 444a and 444b are provided on each assembly 440 for circulating coolant between the assembly and the cooling assembly.

The backplane assembly 430 includes connectors 410 for mating with connectors 446 on the assemblies 440. Preferably, these connectors are oriented perpendicularly to the connectors 134, to which the assemblies 110 engage.

The first and second circuit card assemblies 110 and 440 are also oriented perpendicularly. The assemblies 110 are parallel to a first plane 450, and the assemblies 440 are parallel to a second plane 460. The first and second planes are perpendicular to each other.

As shown in FIG. 5, circuit card assemblies 540 are installed parallel to a backplane 530. These assemblies are preferably liquid cooled, as described above. The assemblies 540 are stacked one on top of the other, in a similar fashion to the way circuit card assemblies 340 are stacked in FIG. 3. However, the assemblies 540 are on the same side of the backplane as the assemblies 110. The backplane 530 has connectors 510 for mating with connectors on the assemblies 540. Although the mating connectors on the assemblies 540 are not visible, they have a pattern that matches that of the connectors 510. These connectors may be oriented in parallel with the connectors 134 for the assemblies 110 (as shown), or they may be oriented perpendicularly with the connectors 134. In either case, the card assemblies 540 themselves are oriented perpendicularly to the card assemblies 110. The assemblies 110 are parallel to a plane 550, and the assemblies 540 are parallel to a plane 560. The planes 550 and 560 are perpendicular to each other.

Each circuit card assembly 540 preferably has an array of connectors 548 for engaging another assembly 540.

As with assemblies 340 in the arrangement 300, the assemblies 540 may be placed one next to the other (not shown). For greater density, they may also be stacked, with different stacks placed one next to the other (not shown).

FIGS. 6-8 show different arrangements, 600, 700, and 800, of circuit card assemblies placed within a card cage 610. The systems 600 and 700 are preferred for the arrangements shown in FIGS. 2-3, including any variations thereof. The system 800 is preferred for the arrangements shown in FIGS. 4-5, including any variations thereof.

As shown in FIG. 6, a backplane, circuit card assemblies of the first type, and circuit card assemblies of the second type (i.e., any of the arrangements shown in FIGS. 2-3) are placed within a card cage 610. The card cage preferably has an intake plenum 612 with an intake aperture 622. The intake aperture is preferably located at the front of the card cage, as shown. An air mover 614 forces air upwardly, through vents 624, and between and through circuit card assemblies 110. Heat is drawn from the circuit card assemblies 110. Heated air flows through vents 626, toward the top of the card cage, and into an exhaust plenum 616. The heated air is exhausted, preferably though an exhaust aperture 620. The exhaust aperture 620 is preferably located at the rear of the card cage.

With this arrangement, air is made to flow bottom-to-top and front-to-back. The bottom-to-top configuration promotes efficiency by reinforcing the effects of convection, which naturally cause heated air to rise. The front-to-back arrangement is particularly well suited to many target applications, in which personnel generally access systems from the front, where air should be kept at a comfortable temperature and exhaust air is directed away from personnel.

The cooling assembly 160 may be placed wherever it conveniently fits. In FIG. 6, the cooling assembly 160 is advantageously placed just below the air intake 622. The intake 164 of the cooling assembly 160 is made to face the same way as the intake 622. Ambient air is made to enter the cooling assembly 160 from its front, and spent air is exhausted from its rear. This placement of the cooling assembly thus maintains the desired front-to-back airflow established for the rest of the system.

When the system of FIG. 6 is turned off, liquid coolant may tend to flow back into the cooling assembly, from the hoses and cold plates of the liquid cooled assemblies. In some circumstances, this may cause the cooling assembly's tank to overflow. This potential problem can be easily overcome, however, by providing the cooling assembly 160 with an oversized tank that is capable of holding all, or nearly all, of the coolant in the system.

Alternatively, the cooling assembly 160 can be placed above the exhaust plenum 616. FIG. 6 shows this variation with the cooling assembly 160 drawn with dotted lines. An oversized tank is not required in this arrangement, as liquid coolant tends to flow down when the system is turned off. Once again, the cooling assembly 160 is preferably placed with its air inlet 164 facing front, to promote front-to-back airflow.

FIG. 7 shows another alternative arrangement 700 for the card configurations of FIGS. 2 and 3. Here, a cooling assembly 710 is placed within the exhaust plenum 616. The cooling assembly 710 may be identical to the cooling assembly 160 described above. However, the cooling assembly's constituents may be advantageously rearranged to allow air to enter from the bottom of the cooling assembly and exhaust from the top. FIG. 7 shows this variation, wherein the cooling assembly 710 has an exhaust vent 712 at its top surface and has a similar inlet vent—not shown—at its bottom surface. Air enters the inlet vent and is exhausted through the exhaust vent 712. The exhausted air then flows out of the exhaust aperture 620.

The arrangement 700 conserves space as compared with the arrangements shown in FIG. 6. However, it is cooled by air that has already been heated by the assemblies 110 and thus tends to be less efficient. According to one variation (not shown), the cooling assembly may be placed inside the inlet plenum 612. With this arrangement, the liquid cooling system receives air at ambient temperature and thus maintains high efficiency. However, the cooling assembly tends to heat the air used for cooling the assemblies 110. Therefore, this variation tends to reduce the cooling effectiveness for the assemblies 110.

FIG. 8 shows an arrangement 800, which is preferred for use with the card configurations of FIGS. 4 and 5. In FIG. 8, the positions of the intake plenum 612 and the outlet plenum 616 are exchanged, and the direction of airflow induced by the air mover 614 is reversed. Air is thus made to flow top-to-bottom and front-to-back. The circuit card assemblies 440/540 (see FIGS. 4 and 5) are preferably placed above the plenum 612, and the liquid cooling assembly 160 is preferably placed above the assemblies 440/540.

An air mass is formed between the inlet 622 and the outlet 620 of the systems 600, 700, and 800. The air mass corresponds to locations within the system in which air can flow. Although the system may be partially open in various places and have "leaks," air generally flows into the inlet, through the air mass, and out of the outlet.

Although hoses (or other types of fluid transport passages) are not shown in any of FIGS. 6-8, it is understood that they are attached between pairs of the coolant ports 166a-h of a cooling assembly and the coolant ports on each of the liquid cooled assemblies.

Having described certain embodiments, numerous alternative embodiments or variations can be made. For example, although the preferred embodiment hereof relates to telecommunication systems employing I/O cards and switch cards, the invention is not limited to these types of systems. Indeed, the invention may be advantageously employed in any application in which signal nodes are aggregated together and switched to other signal nodes, or where different types of electronic assemblies require different cooling capacities.

The invention has been described in relation to electronic signals communicated between circuit card assemblies of a first type and circuit card assemblies of a second type. However, the invention is not limited to applications in which electronic signals are communicated. For instance, the invention may be applied in circumstances in which optical signals are communicated.

Each of the embodiments shown and described involves circuit card assemblies of a first type arranged substantially perpendicularly to circuit card assemblies of a second type. However, it is not required that the arrangements of cards be perpendicular, provided they are non-parallel. Taking the arrangement 300 of FIG. 3 as an example, the assemblies 340 can be rotated so that they slant down and to the right (along the direction of arrow 380). Making this change tilts the plane 360, such that it intersects the plane 350 at an angle different from 90 degrees.

As shown and described, the cooling assemblies 160 and 710 are modular assemblies. They are self-contained units that require only power, coolant, airflow, and fluid connections to the various units to be cooled. However, this is not required. In an alternative arrangement, the elements of the cooling assembly can be distributed. For instance, the pump, tank, and radiator could be placed in different locations. Depending upon where the radiator is placed, air movers may be omitted. In one variation, the radiator is left exposed and placed directly in the air flow path established by the air mover 614. For example, it could be placed in the inlet plenum 612 or in the outlet plenum 616. In another variation, the radiator can be placed on a frame that fits into one or more slots of the backplane. The radiator for the liquid cooling system would thus be air cooled in parallel with the first circuit card assemblies 110.

According to another variation, the heat exchanger need not be a "radiator" at all, but rather a liquid-to-liquid heat exchanger. Here, the temperature of the coolant is reduced through thermal contact with another liquid coolant, such as facility water.

According to yet another variation, the cooling assembly employs refrigeration. Liquid coolant returned to the cooling unit is actively refrigerated to reduce its temperature.

The embodiments shown and described all provide liquid cooling to the circuit card assemblies 140, 340, 440, and 540 of the second type. This is not required, however. Alternatively, these assemblies may be cooled by other methods, such as though the use of air cooling.

Although several arrangements of non-parallel circuit card assemblies are shown and described, these are presented by way of example and are not intended to represent all possible ways of practicing the invention.

Those skilled in the art will therefore understand that various changes in form and detail may be made to the embodiments disclosed herein without departing from the scope of the invention.

What is claimed is:

1. An electronic system, comprising:
   an enclosure;
   a substrate within the enclosure, the substrate being substantially planar and having a first side and a second side, the first and second sides being opposite each other;
   a plurality of first connectors attached to the first side of the substrate and adapted for receiving a plurality of circuit card assemblies arranged side-by-side in an orientation that is substantially parallel to a first plane; and
   at least one second connector attached to the second side of the substrate and adapted for receiving one or more circuit card assemblies having an orientation that is substantially perpendicular to the first plane,
   wherein at least one of the plurality of first connectors is aligned back-to-back with the at least one second connector so that each electrical contact provided in that at least one first connector is interconnected with a corresponding electrical contact in that at least one second connector via a substantially straight path through the substrate.

2. The electronic system as recited in claim 1,
   wherein the at least one second connector is interconnected with each electrical contact provided in more than one of the plurality of first connectors via a substantially straight path through the substrate.

3. The electronic system as recited in claim 2, wherein each second connector is adapted for receiving a substantially planar circuit card assembly in an orientation that is substantially parallel to the substrate.

4. The electronic system as recited in claim 2, wherein each second connector is adapted for receiving a substantially planar circuit card assembly in an orientation that is substantially perpendicular to the substrate.

5. The electronic system as recited in claim 1, wherein the at least one second circuit card comprises a plurality of second circuit cards arranged side-by-side.

6. An electronic system as recited in claim 1, wherein the plurality of first circuit card assemblies comprise I/O cards for sending and receiving network data.

7. An electronic system as recited in claim 6, wherein the at least one second circuit card assembly comprises at least one switch card for routing network data among ones of the plurality of I/O cards.

8. An electronic system as recited in claim 7, wherein each at least one switch card is parallel to the backplane.

9. An electronic system as recited in claim 7, wherein each at least one switch card is perpendicular to the backplane.

10. An electronic system as recited in claim 7, wherein each at least one switch card comprises a plurality of ports for receiving network data from different ones of the plurality of I/O cards.

11. An electronic system as recited in claim 10, wherein the plurality of ports are SerDes ports.

12. An electronic system, comprising:
    an enclosure;
    a substrate with a first side and a second side, the first and second sides being opposite each other;
    a plurality of first connectors attached to the first side of the substrate and arranged side-by-side within the enclosure, the plurality of first connectors being adapted for receiving a plurality of first circuit card assemblies substantially parallel to a first plane;
    at least one second connector attached to the second side of the substrate and disposed within the enclosure, the at least one second connector being adapted for receiving at least one circuit card assembly substantially perpendicular to the first plane;
    an air cooling pathway for cooling the plurality of first circuit card assemblies with air; and
    a liquid transport pathway, including a heat exchanger, for cooling the at least one second circuit card assembly with a liquid,
    wherein at least one of the plurality of first connectors is aligned back-to-back with the at least one second connector so that each electrical contact provided in that at least one first connector is interconnected with a corresponding electrical contact in that at least one second connector via a substantially straight path through the substrate.

13. The electronic system as recited in claim 12, wherein the air cooling path comprises:
    an inlet;
    an outlet;
    an air mover coupled between the inlet and the outlet; and
    an air mass within the enclosure, coupled between the inlet and the outlet.

14. The electronic system as recited in claim 13, wherein the heat exchanger comprises a liquid-to-air heat exchanger.

15. The electronic system as recited in claim 14, wherein the liquid-to-air heat exchanger is disposed in the air cooling path.

16. The electronic system as recited in claim 14, wherein the liquid-to-air heat exchanger has a cooling path that is separated from the air cooling path by the substrate.

17. The electronic system as recited in claim 12, wherein the liquid transport pathway includes a liquid-to-liquid heat exchanger.

18. The electronic system as recited in claim 13, further comprising the plurality of first circuit card assemblies and the at least one second circuit card assembly.

19. The electronic system as recited in claim 18, wherein the plurality of first circuit card assemblies comprise a plurality of heat sinks disposed within the air mass.

20. The electronic system as recited in claim 12, further comprising a backplane having first and second surfaces.

21. The electronic system as recited in claim 20, wherein the plurality of first circuit card assemblies are attached to the first surface of the backplane the at least one second circuit card assembly is attached to the second surface of the backplane.

22. The electronic system as recited in claim 20, wherein the plurality of first circuit card assemblies and the at least one second circuit card assembly are attached to the first surface of the backplane.

23. The electronic system as recited in claim 12, wherein the plurality of first circuit card assemblies comprise I/O cards for sending and/or receiving computer network data, and the at least one second circuit card assembly comprises at least one switch card for routing network data among ones of the plurality of I/O cards.

24. The electronic system as recited in claim 12, wherein the liquid transport pathway comprises a cooling assembly module comprising:
   a radiator;
   an air mover arranged for forcing air through the radiator; and
   a pump arranged for circulating liquid coolant through the radiator.

25. A backplane assembly for an electronic system comprising:
   a substantially planar substrate having a first side and a second side, the first and second sides being opposite each other;
   a plurality of first connectors attached to the first side of the substrate for engaging a plurality of circuit card assemblies in an orientation that is substantially parallel to a first plane; and
   at least one second connector attached to the second side of the substrate for engaging at least one circuit card assembly in an orientation that is substantially perpendicular to the first plane,
   wherein at least one of the plurality of first connectors is aligned back-to-back with the at least one second connector so that each electrical contact provided in that at least one first connector is interconnected with a corresponding electrical contact in that at least one second connector via a substantially straight path through the substrate.

26. The backplane assembly as recited in claim 25, wherein the plurality of first connectors are nominally first through N-th connectors arranged in order, and the at least one second connector extends from an area adjacent to the first connector to an area adjacent to the N-th connector.

* * * * *